US 9,401,420 B2
Jul. 26, 2016

(12) United States Patent
Shikauchi et al.

(54) SEMICONDUCTOR DEVICE

(71) Applicants: SANKEN ELECTRIC CO., LTD., Niiza-shi, Saitama (JP); SHIN-ETSU HANDOTAI CO., LTD., Tokyo (JP)

(72) Inventors: Hiroshi Shikauchi, Niiza (JP); Ken Sato, Miyoshi-machi (JP); Hirokazu Goto, Minato-ku (JP); Masaru Shinomiya, Annaka (JP); Keitaro Tsuchiya, Takasaki (JP); Kazunori Hagimoto, Takasaki (JP)

(73) Assignees: SHANKEN ELECTRIC CO., LTD., Saitama (JP); SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/891,942

(22) PCT Filed: May 2, 2014

(86) PCT No.: PCT/JP2014/002407
§ 371 (c)(1),
(2) Date: Nov. 17, 2015

(87) PCT Pub. No.: WO2014/192229
PCT Pub. Date: Dec. 4, 2014

(65) Prior Publication Data
US 2016/0118486 A1    Apr. 28, 2016

(30) Foreign Application Priority Data
May 31, 2013    (JP) .................................. 2013-116030

(51) Int. Cl.
*H01L 29/778*    (2006.01)
*H01L 21/02*    (2006.01)
*H01L 29/66*    (2006.01)
(Continued)

(52) U.S. Cl.
CPC ........ *H01L 29/7783* (2013.01); *H01L 21/0254* (2013.01); *H01L 21/02381* (2013.01);
(Continued)

(58) Field of Classification Search
CPC ............ H01L 29/7783; H01L 29/2003; H01L 29/205
See application file for complete search history.

(56) References Cited

U.S. PATENT DOCUMENTS

| 2009/0200645 A1* | 8/2009 | Kokawa | ................ | H01L 29/045 257/615 |
| 2010/0237387 A1* | 9/2010 | Sato | .................. | H01L 21/02381 257/190 |

(Continued)

FOREIGN PATENT DOCUMENTS

| JP | 2008-205117 A | 9/2008 |
| JP | 2010-219176 A | 9/2010 |
| JP | 2011-018844 A | 1/2011 |

OTHER PUBLICATIONS

Aug. 12, 2014 International Search Report issued in International Patent Application No. PCT/JP2014/002407.
Dec. 1, 2015 International Preliminary Report on Patentability issued in International Patent Application No. PCT/JP2014/002407.

*Primary Examiner* — Ermias Woldegeorgis
(74) *Attorney, Agent, or Firm* — Oliff PLC

(57) ABSTRACT

Semiconductor device including: silicon-based substrate; first buffer layer on silicon-based substrate and is formed of first layer containing Al composition and second layer containing less Al than the first layer, the first and second layers being alternately stacked; second buffer layer on the first buffer layer and is formed of third layer containing Al composition and fourth layer containing less Al than the third layer, the third and fourth layers being alternately stacked; and third buffer layer on the second buffer layer and is formed of fifth layer containing Al composition and sixth layer containing less Al than the fifth layer, the fifth and sixth layers being alternately stacked, wherein the second buffer layer contains more Al than the first and third buffer layers. Thus, the semiconductor device leakage can be suppressed while reducing stress which is applied to buffer layer and can improve flatness of active layer upper face.

9 Claims, 3 Drawing Sheets

(51) Int. Cl.
*H01L 29/20* (2006.01)
*H01L 29/205* (2006.01)

(52) U.S. Cl.
CPC .... *H01L21/02458* (2013.01); *H01L 21/02507* (2013.01); *H01L 29/2003* (2013.01); *H01L 29/205* (2013.01); *H01L 29/66462* (2013.01); *H01L 29/7787* (2013.01)

(56) References Cited

U.S. PATENT DOCUMENTS

2010/0244096 A1* 9/2010 Sato .................. H01L 21/02381
257/190
2011/0006308 A1 1/2011 Sato

* cited by examiner

SEMICONDUCTOR DEVICE

BACKGROUND OF THE INVENTION

1. Field of the Invention

The present invention relates to semiconductor devices and, in particular, to a semiconductor device having a nitride semiconductor layer.

2. Description of the Related Art

A nitride semiconductor layer is usually formed on an inexpensive silicon substrate or sapphire substrate. However, the lattice constants of these substrates greatly differ from the lattice constant of the nitride semiconductor layer and they also have different coefficients of thermal expansion. Therefore, a high amount of distortion energy is generated in the nitride semiconductor layer formed on the substrate by epitaxial growth. As a result, a crack easily appears in the nitride semiconductor layer and crystal quality is easily reduced.

To solve the above-described problem, a method of disposing a buffer layer formed of stacked nitride semiconductor layers between a silicon substrate and an active layer formed of a nitride semiconductor, is proposed (refer to, for example, Patent Document 1).

A semiconductor wafer having a buffer layer of Patent Document 1 is depicted in FIG. 4.

In FIG. 4, a buffer layer 3 is provided between a silicon substrate 2 and an active layer 4, and the buffer layer 3 has a first multi-layer structure buffer region 5, a second single-layer structure buffer region 8 which is formed of GaN and is provided on the first multi-layer structure buffer region 5, and a second multi-layer structure buffer region 5' provided on the second single-layer structure buffer region 8.

Furthermore, the first multi-layer structure buffer region 5 and the second multi-layer structure buffer region 5' each have a multi-layer structure in which a sub multi-layer structure buffer region 6 and a first single-layer structure buffer region 7 which is formed of GaN and is thinner than the second single-layer structure buffer region 8 are repeatedly stacked.

Moreover, the sub multi-layer structure buffer region 6 has a multi-layer structure in which a first layer formed of AlN and a second layer formed of GaN are repeatedly stacked.

In Patent Document 1, it is disclosed that a warpage in a semiconductor wafer is reduced by forming the first layer with a nitride semiconductor containing aluminum in a first proportion and making the proportion (including zero) of aluminum in the second layer, the first single-layer structure buffer region 7, and the second single-layer structure buffer region 8 smaller than the first proportion.

CITATION LIST

Patent Literatures

Patent Document 1: Japanese Unexamined Patent Application (Kokai) No. 2008-205117

SUMMARY OF THE INVENTION

As described above, to improve the characteristics of a nitride semiconductor layer formed on a silicon substrate or a sapphire substrate, providing a buffer layer and optimizing the constitution of the buffer layer have been performed.

However, the present inventors have found the following problems.

That is, when the buffer layer is formed as a multi-layered buffer in which AlN/GaN with a fixed thickness is repeated and a GaN layer of the multi-layered buffer layer is made thicker, a crack undesirably appears in the buffer layer or the active layer or a warpage cannot be adjusted due to a difference in coefficient of thermal expansion from the substrate.

On the other hand, when the GaN layer forming the buffer layer is made thinner, a leakage current in the buffer layer undesirably increases.

Moreover, when the buffer layer is formed to have an AlN/GaN superlattice structure, as is the case with the buffer layer whose total film thickness is made larger, a warpage becomes a problem.

Furthermore, in the buffer structure disclosed in Patent Document 1, since the single layer buffer region 8 formed of thick GaN is provided, projections and depressions are generated in an upper face of the buffer layer 3, thereby, the projections and depressions are transferred to an upper face of the active layer 4, which impairs the flatness of the upper face of the active layer 4, and the electrical characteristics of the semiconductor device undesirably vary or the characteristics are undesirably deteriorated.

In addition, if the buffer layer is formed so as to be thick by inserting the single-layer structure buffer region 8 formed of thick GaN, warpage occurs in a film forming apparatus due to a difference in coefficient of thermal expansion between the buffer layer and the substrate, which may make inadequate the adjustment of stress between the substrate and a layer on the substrate when the substrate is taken out from the film forming apparatus and cause a warpage or a crack in some cases.

The present invention has been made in view of the above-described problems, and an object thereof is to provide a semiconductor device in which leakage can be suppressed while reducing stress which is applied to a buffer layer and the flatness of an active layer upper face can be improved.

To attain the above-described object, the present invention provides a semiconductor device including: a silicon-based substrate; a first buffer layer that is provided on the silicon-based substrate and is formed of a first layer containing an Al composition and a second layer containing less Al than the first layer, the first layer and the second layer being alternately stacked; a second buffer layer that is provided on the first buffer layer and is formed of a third layer containing an Al composition and a fourth layer containing less Al than the third layer, the third layer and the fourth layer being alternately stacked; and a third buffer layer that is provided on the second buffer layer and is formed of a fifth layer containing an Al composition and a sixth layer containing less Al than the fifth layer, the fifth layer and the sixth layer being alternately stacked, wherein the second buffer layer contains, as a whole, more Al than the first buffer layer and the third buffer layer.

As described above, by making a layer in the central part of the buffer layer (the second buffer layer) contain more Al than a layer in the upper part of the buffer layer (the third buffer layer) and a layer in the lower part of the buffer layer (the first buffer layer), lattice relaxation (a misfit dislocation) is generated more greatly in the central part of the buffer layer, which makes it possible to reduce stress which is applied to the buffer layer.

Moreover, by making the layer in the central part of the buffer layer (the second buffer layer) have a multi-layer structure including a layer containing an Al composition (the third layer) and increasing the aluminum composition of the entire buffer layer, it is possible to reduce a leakage current.

Furthermore, by making the layer in the central part of the buffer layer (the second buffer layer) have a multi-layer structure including the layer containing an Al composition (the third layer), it is possible to improve the flatness of a buffer layer upper face and thereby improve the flatness of an active layer upper face.

Here, it is preferable that an active layer provided on the third buffer layer is further provided, the first layer is formed as a layer in which a first sublayer containing an Al composition and a second sublayer containing less Al than the first sublayer are repeatedly formed, the fifth layer is formed as a layer in which a third sublayer containing an Al composition and a fourth sublayer containing less Al than the third sublayer are repeatedly formed, the second sublayer and the fourth sublayer have a thickness less than a critical film thickness, the second layer contains less Al than the first sublayer and is thicker than the second sublayer, the sixth layer contains less Al than the fourth sublayer and is thicker than the fourth sublayer, the fourth layer is thicker than the second sublayer and the fourth sublayer, is thinner than the second layer and the sixth layer, and has a thickness more than or equal to the critical film thickness, and the fourth layer contains more dislocations than the second layer and the sixth layer.

As described above, by making the fourth layer included in the layer in the central part of the buffer layer thicker than the second sublayer included in the layer in the lower part of the buffer layer and the fourth sublayer included in the layer in the upper part of the buffer layer, lattice relaxation (a misfit dislocation) is easily generated in the fourth layer included in the layer in the central part of the buffer layer, whereby the range of stress control is enlarged, making it possible to form a thicker buffer layer as a whole.

Moreover, the second sublayer, the second layer, the fourth layer, the fourth sublayer, and the sixth layer may be formed of GaN.

As the second sublayer, the second layer, the fourth layer, the fourth sublayer, and the sixth layer which form the buffer layer, the above-described material can be suitably used.

Furthermore, the first sublayer, the third layer, and the third sublayer may be formed of AlN.

As the first sublayer, the third layer, and the third sublayer which form the buffer layer, the above-described material can be suitably used.

Moreover, it is preferable that a layer among a plurality of the third layers which is closer to the third buffer layer, contains less Al.

As described above, in the layer in the central part of the buffer layer, the closer a third layer and a fourth layer which are adjacent to each other to the active layer, the smaller the difference in Al composition ratio between the third layer and the fourth layer which are adjacent to each other is made, whereby it is possible to enhance the stress relaxation effect on the lower side and enhance the effect of increasing crystallinity rather than the stress relaxation effect on the upper side.

Furthermore, it is preferable that a layer among a plurality of the third layers forming the second buffer layer, the layer being disposed in a central part of the second buffer layer, contains less Al than the third layers disposed on upper surface side of the second buffer layer and the third layers disposed on lower surface side of the second buffer layer.

As described above, in the layer in the central part of the buffer layer, a difference in Al composition ratio between a third layer and a fourth layer which are adjacent to each other is made small in the central part, whereby, it is possible to enhance the stress relaxation effect on the lower and upper sides and enhance the effect of increasing crystallinity rather than the stress relaxation effect in the central part.

As described above, according to the present invention, it is possible to provide a semiconductor device in which leakage while reducing stress which is applied to a buffer layer and the flatness of an active layer upper face can be improved.

DETAILED DESCRIPTION OF THE PREFERRED EMBODIMENTS

Hereinafter, an example of an embodiment of the present invention will be described in detail with reference to the drawings, but the present invention is not limited thereto.

As described earlier, in a conventional buffer layer, since a single layer buffer region formed of thick GaN is inserted on the side where the central part of the buffer layer, projections and depressions are generated in an upper face of the buffer layer, thereby the projections and depressions are transferred to an upper face of an active layer, which impairs the flatness of the upper face of the active layer, and the electrical characteristics of a semiconductor device undesirably vary or the characteristics are undesirably deteriorated.

Furthermore, by inserting a single-layer structure buffer region formed of thick GaN on the side where the central part of the buffer layer, when the buffer layer becomes thick, warpage occurs in a film forming apparatus due to a difference in coefficient of thermal expansion between the buffer layer and a substrate, which may make inadequate the adjustment of stress between the substrate and a layer on the substrate when the substrate is taken out from the film forming apparatus and cause a warpage or a crack in some cases.

Therefore, the present inventors made a diligent study of a semiconductor device in which the flatness of an active layer upper face can be improved while reducing stress which is applied to on a buffer layer.

As a result, the present inventors have found that it is possible to reduce stress which is placed on the buffer layer, reduce a leakage current, and improve the flatness of the active layer upper face by making a layer in the central part of the buffer layer (a second buffer layer) contain more Al than a layer in the upper part of the buffer layer (a third buffer layer) and a layer in the lower part of the buffer layer (a first buffer layer) and making the layer in the central part of the buffer layer (the second buffer layer) have a multi-layer structure including a layer containing an Al composition (a third layer), thereby bringing the present invention to completion.

Figure 1:
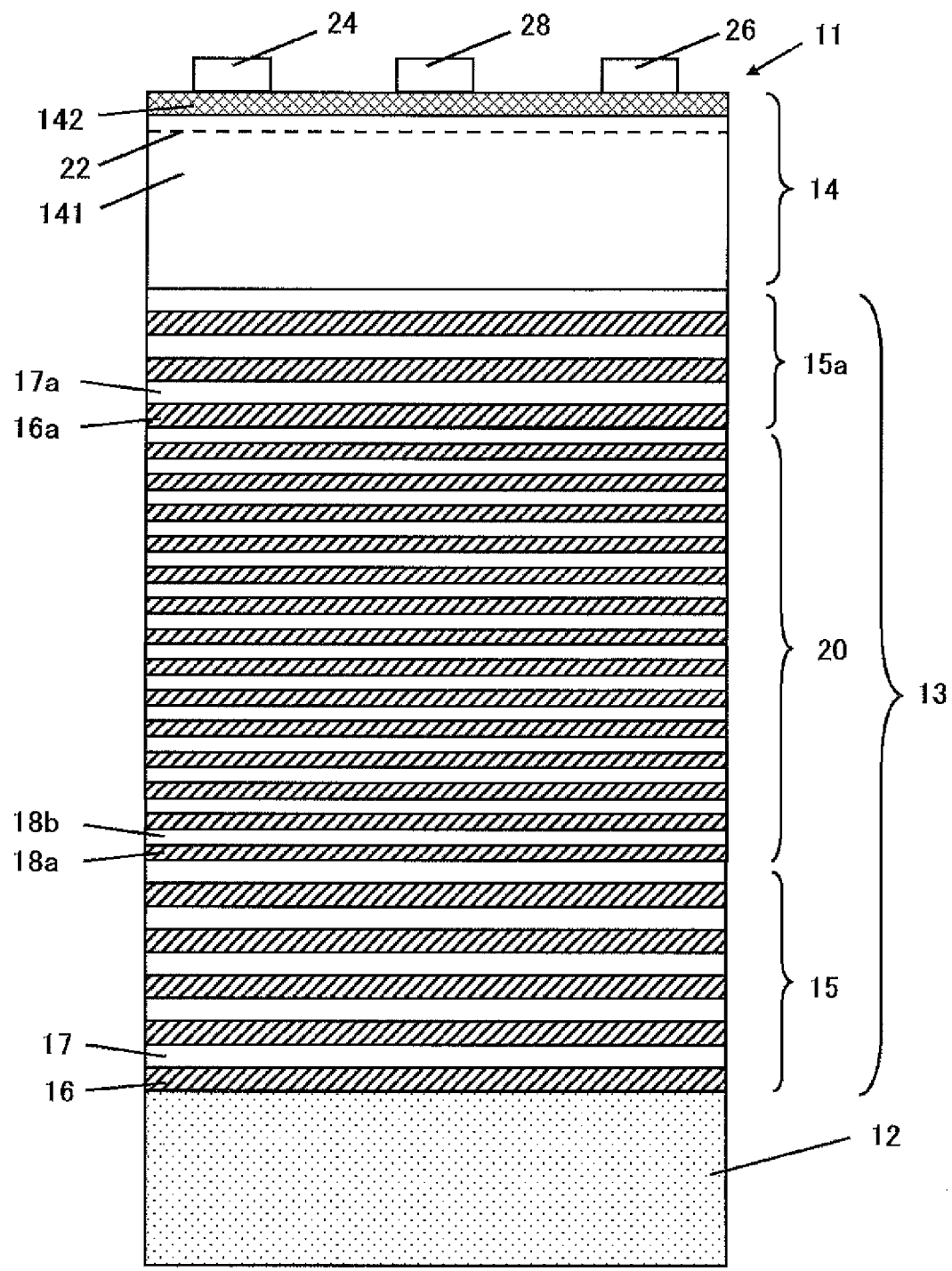
FIG. 1 is a schematic sectional view depicting an example of an embodiment of a semiconductor device of the present invention.

FIG. 1 is a schematic sectional view depicting an example of a semiconductor device of the present invention.

A semiconductor device 11 of the present invention depicted in FIG. 1 includes a silicon-based substrate 12, a buffer layer 13 provided on the silicon-based substrate 12, an active layer 14 provided on the buffer layer 13, and a first electrode 24, a second electrode 26, and a control electrode 28 which are provided on the active layer 14.

Here, the silicon-based substrate 12 is a substrate formed of Si or SiC, for example.

The buffer layer 13 includes a first buffer layer 15, a second buffer layer 20 provided on the first buffer layer 15, and a third buffer layer 15a provided on the second buffer layer 20.

The first buffer layer 15 is formed of a first layer 16 containing an Al composition and a second layer 17 containing less Al than the first layer 16, the first layer 16 and the second layer 17 being alternately stacked.

The second buffer layer 20 is formed of a third layer 18a containing an Al composition and a fourth layer 18b containing less Al than the third layer 18a, the third layer 18a and the fourth layer 18b being alternately stacked.

The third buffer layer 15a is formed of a fifth layer 16a containing an Al composition and a sixth layer 17a containing less Al than the fifth layer 16a, the fifth layer 16a and the sixth layer 17a being alternately stacked.

The active layer 14 further includes a channel layer 141 and a barrier layer 142 provided on the channel layer 141.

The first electrode 24 and the second electrode 26 are disposed in such a way that a current flows from the first electrode 24 to the second electrode 26 via two-dimensional electron gas 22 formed in the channel layer 141.

The current flowing between the first electrode 24 and the second electrode 26 can be controlled by a potential which is applied to the control electrode 28.

The second buffer layer 20 which is a layer in the central part of the buffer layer 13 contains, as a whole, more Al than the first buffer layer 15 and the third buffer layer 15a.

As a result, lattice relaxation (a misfit dislocation) is generated greatly in the central part of the buffer layer 13, which makes it possible to reduce stress which is applied to the buffer layer 13.

Moreover, by making the second buffer layer 20 which is a layer in the central part of the buffer layer 13 have a multi-layer structure including a layer containing an Al composition (the third layer 18a) and increasing the aluminum composition of the entire buffer layer 13, it is possible to reduce a leakage current.

Furthermore, by a making the second buffer layer 20 which is a layer in the central part of the buffer layer 13 have a multi-layer structure including a layer containing an Al composition (the third layer 18a), it is possible to improve the flatness of a buffer layer upper face and thereby improve the flatness of an active layer upper face.

Figure 2:
FIG. 2 is a schematic sectional view depicting the details of a first layer of FIG. 1.

As depicted in an enlarged view of FIG. 2, the first layer 16 may be formed as a layer in which a first sublayer 16' containing an Al composition and a second sublayer 16" containing less Al than the first sublayer 16' are repeatedly formed.

Figure 3:
FIG. 3 is a schematic sectional view depicting the details of a fifth layer of FIG. 1.
Figure 4:
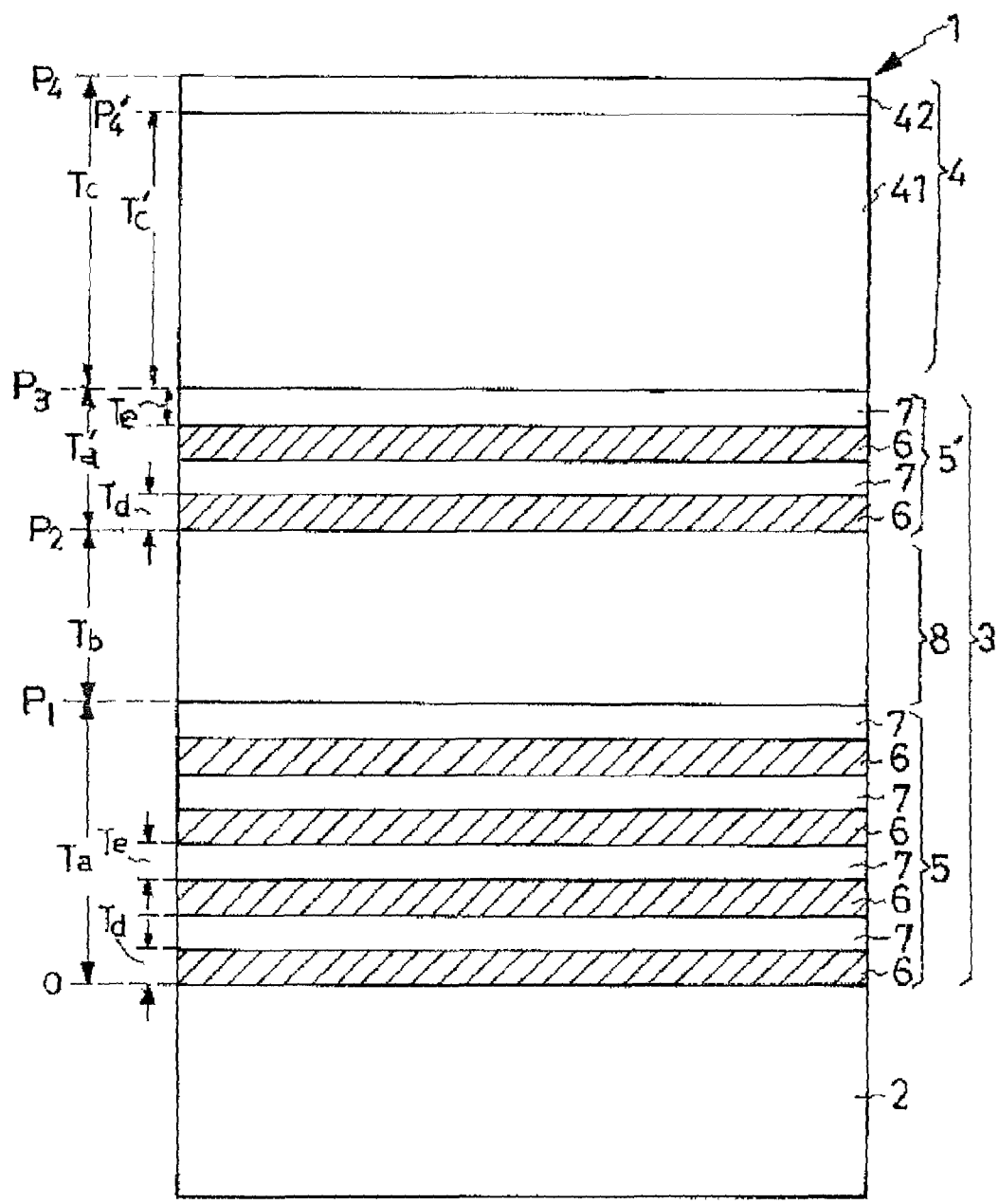
FIG. 4 is a schematic sectional view of a semiconductor wafer having a conventional buffer layer.

Moreover, as depicted in an enlarged view of FIG. 3, the fifth layer 16a may be formed as a layer in which a third sublayer 16a' containing an Al composition and a fourth sublayer 16a" containing less Al than the third sublayer are repeatedly formed.

The second sublayer 16" and the fourth sublayer 16a" may be sublayers having a thickness less than a critical film thickness (a film thickness more than or equal to the critical film thickness can surely cause a misfit dislocation).

The second layer 17 may be a layer which contains less Al than the first sublayer 16' and is thicker than the second sublayer 16".

The sixth layer 17a may be a layer which contains less Al than the fourth sublayer 16a" and is thicker than the fourth sublayer 16".

The fourth layer 18b may be a layer which is thicker than the second sublayer 16" and the fourth sublayer 16a", is thinner than the second layer 17 and the sixth layer 17a, and has a thickness more than or equal to the critical film thickness.

Since the second layer 17 and the sixth layer 17a are thicker than the fourth layer 18b, the likelihood that the misfit dislocation generated in the lower part of the layer stops somewhere in the layer is increased, whereby more misfit dislocations occur in the fourth layer 18b than in the second layer 17 and the sixth layer 17a.

Incidentally, it is preferable that the fourth layer 18b is 3.5 to 200 nm. If the fourth layer 18b is within this range, it is possible to generate a misfit dislocation surely.

Moreover, it is more preferable that the fourth layer 18b is 5 to 50 nm. If the fourth layer 18b is within this range, it is possible to generate a misfit dislocation more surely.

Therefore, if the layers of the buffer layer 13 have the above-described film thickness relationship, lattice relaxation (a misfit dislocation) is easily generated in the fourth layer included in the layer in the central part of the buffer layer, whereby the range of stress control is enlarged, making it possible to form a thicker buffer layer as a whole.

The second sublayer 16", the second layer 17, the fourth layer 18b, the fourth sublayer 16a", and the sixth layer 17a are GaN, for example.

The first sublayer 16', the third layer 18a, and the third sublayer 16a' are AlN, for example.

Moreover, it is preferable that a third layer 18a among the third layers 18a forming the second buffer layer 20, the third layer 18a which is closer to the third buffer layer 15a, that is, to the active layer 14, is made to contain less Al.

As described above, in the layer in the central part of the buffer layer, the closer a third layer 18a and a fourth layer 18b which are adjacent to each other to the third buffer layer 15a, that is, to the active layer 14, the smaller the difference in Al composition ratio between the third layer 18a and the fourth layer 18b is made, whereby it is possible to enhance the stress relaxation effect on the lower side and enhance the effect of increasing crystallinity rather than the stress relaxation effect on the upper side.

Furthermore, it is preferable that a third layer among a plurality of third layers 18a forming the second buffer layer 20, the third layer being disposed in a central part of the second buffer layer 20, is made to contain less Al than the third layers disposed on upper surface side of the second buffer layer 20 and the third layers disposed on lower surface side of the second buffer layer 20.

As described above, in the layer in the central part of the buffer layer, a difference in Al composition ratio between the third layer 18a and the fourth layer 18b which are adjacent to each other is made to small in the central part, whereby it is possible to enhance the stress relaxation effect on the lower and upper sides and enhance the effect of increasing crystallinity rather than the stress relaxation effect in the central part.

Next, a method for producing the semiconductor device of the present invention will be described.

First, a first buffer layer 15 which forms a buffer layer 13 is formed on a silicon-based substrate 12.

Specifically, the first buffer layer 15 is formed by alternately growing a first layer 16 and a second layer 17 formed of GaN, the first layer 16 being formed by alternately growing a first sublayer 16' formed of AlN and a second sublayer 16" formed of GaN, by MOVPE (metal-organic-vapor-phase epitaxy) method.

The film thickness of the first sublayer 16' is 3 to 7 nm, for example, the film thickness of the second sublayer 16" is 2 to 5 nm, for example, and the film thickness of the second layer 17 is 100 to 500 nm, for example, preferably, 100 to 300 nm.

The number of the first layers 16 and the second layers 17 which are repeatedly formed may be set at 4 to 7, for example, and the number of the first sublayers 16' and the second sublayers 16" which are repeatedly formed may be set at 1 to 15, for example.

Next, on the first buffer layer 15, a second buffer layer 20 which forms a buffer layer 13 is formed.

Specifically, a second buffer layer 20 is formed by alternately growing a third layer 18a formed of AlN and a fourth layer 18b formed of GaN by MOVPE method.

The film thickness of the third layer 18a is 3 to 7 nm, for example, and the film thickness of the fourth layer 18b is 3.5 to 200 nm, for example.

The number of the third layers 18a and the fourth layers 18b which are repeatedly formed may be set at 10 to 100, for example.

Next, on the second buffer layer 20, a third buffer layer 15a which forms the buffer layer 13 is formed.

Specifically, the third buffer layer 15a is formed by alternately growing a fifth layer 16a and a sixth layer 17a formed of GaN, the fifth layer 16a being formed by alternately growing a third sublayer 16a' formed of AlN and a fourth sublayer 16a" formed of GaN, by MOVPE method.

The film thickness of the third sublayer 16a' is 3 to 7 nm, for example, the film thickness of the fourth sublayer 16a" is 2 to 5 nm, for example, and the film thickness of the sixth layer 17a is 100 to 500 nm, for example, preferably, 100 to 300 nm.

The number of the fifth layers 16a and the sixth layers 17a which are repeatedly formed may be set at 4 to 7, for example, and the number of the third sublayers 16a' and the fourth sublayers 16a" which are repeatedly formed may be set at 1 to 15, for example.

Incidentally, making the number of the third sublayers 16a' and the fourth sublayers 16a" smaller than the number of the first sublayers 16' and the second sublayers 16" can improve crystallinity.

Next, on the buffer layer 13, an active layer 14 is formed.

Specifically, on the buffer layer 13, a channel layer 141 formed of GaN and a barrier layer 142 formed of AlGaN are sequentially grown by MOVPE method. The film thickness of the channel layer 141 is 1000 to 4000 nm, for example, and the film thickness of the barrier layer 142 is 10 to 50 nm, for example.

Next, on the active layer 14, a first electrode 24, a second electrode 26, and a control electrode 28 are formed.

The first electrode 24 and the second electrode 26 can be formed as a Ti/Al stacked film, for example, and the control electrode 28 can be formed, for example, as a stacked film formed of a lower layer film made of a metal oxide such as SiO or SiN and an upper layer film made of metal such as Ni, Au, Mo, or Pt.

By the above-described production method, the semiconductor device depicted in FIG. 1 can be obtained.

EXAMPLES

Hereinafter, the present invention will be described more specifically by using Example and Comparative Example, but the present invention is not limited thereto.

Example 1

By the above-described production method, a semiconductor device depicted in FIG. 1 was produced. A first layer 16 was made to have a stacked structure depicted in FIG. 2, and a fifth layer 16a was made to have a stacked structure depicted in FIG. 3.

Incidentally, the first sublayer 16', the third layer 18a, and the third sublayer 16a' were formed of AlN and the second sublayer 16", the second layer 17, the fourth layer 18b, and the fourth sublayer 16a" were formed of GaN.

Comparative Example 1

A semiconductor device was produced in the manner similar to Example 1. However, the second buffer layer 20 was made to have a single layer structure formed of GaN.

It was confirmed that, as compared to the semiconductor device of Comparative Example 1, the semiconductor device of Example 1 could suppress leakage while reducing stress which is placed on the buffer layer and improve the flatness of the active layer upper face.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

The invention claimed is:

1. A semiconductor device comprising:
   a silicon-based substrate;
   a first buffer layer that is provided on the silicon-based substrate and is formed of a first layer containing an Aluminum composition and a second layer containing less Aluminum composition than the first layer, the first layer and the second layer being alternately stacked;
   a second buffer layer that is provided on the first buffer layer and is formed of a third layer containing an Aluminum composition and a fourth layer containing less Aluminum compostion than the third layer, the third layer and the fourth layer being alternately stacked; and
   a third buffer layer that is provided on the second buffer layer and is formed of a fifth layer containing an Aluminum composition and a sixth layer containing less Aluminum composition than the fifth layer, the fifth layer and the sixth layer being alternately stacked,
   wherein
   the second buffer layer contains, as a whole, more Aluminum composition than the first buffer layer and the third buffer layer, and
   the fourth layer has a thickness more than or equal to a critical film thickness and contains more dislocations than the second layer and the sixth layer.

2. The semiconductor device according to claim 1, further comprising:
   an active layer provided on the third buffer layer,
   wherein
   the first layer is formed as a layer in which a first sublayer containing an Aluminum composition and a second sublayer containing less Aluminum composition than the first sublayer are repeatedly formed,
   the fifth layer is formed as a layer in which a third sublayer containing an Aluminum composition and a fourth sublayer containing less Aluminum composition than the third sublayer are repeatedly formed,
   the second sublayer and the fourth sublayer have a thickness less than the critical film thickness,
   the second layer contains less Aluminum composition than the first sublayer and is thicker than the second sublayer,
   the sixth layer contains less Aluminum composition than the fourth sublayer and is thicker than the fourth sublayer,
   the fourth layer is thicker than the second sublayer and the fourth sublayer and is thinner than the second layer and the sixth layer.

3. The semiconductor device according to claim 2, wherein the second sublayer, the second layer, the fourth layer, the fourth sublayer, and the sixth layer are formed of GaN.

4. The semiconductor device according to claim 2, wherein the first sublayer, the third layer, and the third sublayer are formed of AlN.

5. The semiconductor device according to claim 3, wherein the first sublayer, the third layer, and the third sublayer are formed of AlN.

6. The semiconductor device according to claim 1, wherein a layer among a plurality of the third layers which is closer to the third buffer layer, contains less Aluminum composition.

7. The semiconductor device according to claim 2, wherein a layer among a plurality of the third layers which is closer to the third buffer layer, contains less Aluminum composition.

8. The semiconductor device according to claim 1, wherein a layer among a plurality of the third layers forming the second buffer layer, the layer disposed in a central part of the second buffer layer, contains less Aluminum composition than the third layers disposed on upper surface side of the second buffer layer and the third layers disposed on lower surface side of the second buffer layer.

9. The semiconductor device according to claim 2, wherein a layer among a plurality of the third layers forming the second buffer layer, the layer disposed in a central part of the second buffer layer, contains less Aluminum composition than the third layers disposed on upper surface side of the second buffer layer and the third layers disposed on lower surface side of the second buffer layer.

* * * * *